(12) United States Patent
Sridharan et al.

(10) Patent No.: US 6,810,499 B2
(45) Date of Patent: Oct. 26, 2004

(54) PRODUCT CODE BASED FORWARD ERROR CORRECTION SYSTEM

(75) Inventors: Satish Sridharan, West Hills, CA (US); Michael Jarchi, Northridge, CA (US); Timothy Coe, Oxnard, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 404 days.

(21) Appl. No.: 09/874,158

(22) Filed: Jun. 4, 2001

(65) Prior Publication Data

US 2002/0049947 A1 Apr. 25, 2002

Related U.S. Application Data

(63) Continuation-in-part of application No. 09/587,150, filed on Jun. 2, 2000.

(51) Int. Cl.$^7$ .............................................. H03M 13/00
(52) U.S. Cl. ........................................ 714/755; 714/782
(58) Field of Search ............................... 714/755, 756, 714/782, 746, 751, 752, 804, 704

(56) References Cited

U.S. PATENT DOCUMENTS

| | | | |
|---|---|---|---|
| 4,077,028 A | 2/1978 | Lui et al. .................. | 340/146.1 |
| 4,099,160 A | 7/1978 | Flagg ....................... | 340/146.1 |
| 4,142,174 A | 2/1979 | Chen et al. ............... | 340/146.1 |
| 4,162,480 A | 7/1979 | Berlekamp ................ | 340/146.1 |
| 4,410,989 A | 10/1983 | Berlekamp .................... | 371/40 |
| 4,413,340 A | 11/1983 | Odaka et al. ................. | 371/39 |
| 4,475,194 A | * 10/1984 | LaVallee et al. ............. | 714/710 |

(List continued on next page.)

FOREIGN PATENT DOCUMENTS

| | | |
|---|---|---|
| EP | 0 387 924 A2 | 9/1990 |
| WO | PCT/ISA/220 | 10/2000 |

OTHER PUBLICATIONS

Wang, et al., "VLSI Architectures for Computing Multiplications and Inverses in $GF(2^m)$," IEEE Transaction on Computers, vol. C–34, No. 8, pp. 709–717, Aug. 1985.

Shao, et al., "A VLSI Design of a Pipeline Reed–Solomon Decoder," IEEE Transaction on Computers, vol. C–34, No. 5, pp. 393–403, Aug. 1985.

Eastman, "Euclideanization of the Berlekamp–Massey Algorithm" from the Proceedings of the 1988 Tactical Communications Conference, vol. 1 (1988), pp. 295–303.

Choomchuay, Arambepola, "Reed–Solomon Decoding," IEEE Proceedings–1, vol. 140, No. 3, Jun. 1993.

Manuscript: Neifeld, Hayes, "Optical and Electronic Error Correction Schemes for Highly Parallel Access Memories," Proceedings of the SPIE—The International Society for Optical Engineering vol. 2026 (1993) p543–53.

Thesis: Sridharan, "VLSI Implementation of a Spectral Domain Parallel Error Decoder," University of Arizona, 1995.

Neifeld, Hayes, "Error–Correction Schemes for Volume Optical Memories," Applied Optics, vol. 34, No. 35 pp. 8183–8191, Dec. 1995.

(List continued on next page.)

*Primary Examiner*—Albert Decady
*Assistant Examiner*—Joseph D. Torres
(74) *Attorney, Agent, or Firm*—Christie, Parker & Hale, LLP

(57) ABSTRACT

A multidimensional forward error correction system. Transmitted data is encoded by an encoder in multiple dimensions. The decoding of received data by a decoder is performed in multiple passes, with corrected data rewritten into memory. The encoder in one embodiment comprises a parallel column decoder and multiple row encoders encoding a (255, 239) BCH code.

17 Claims, 19 Drawing Sheets

U.S. PATENT DOCUMENTS

| | | | |
|---|---|---|---|
| 4,494,234 A | 1/1985 | Patel | 371/38 |
| 4,504,948 A | 3/1985 | Patel | 371/38 |
| 4,587,627 A | 5/1986 | Omura et al. | 364/754 |
| 4,633,470 A | 12/1986 | Welch et al. | 371/37 |
| 4,633,471 A | 12/1986 | Perera et al. | 371/38 |
| 4,653,052 A | 3/1987 | Doi et al. | |
| 4,718,067 A | 1/1988 | Peters | 371/38 |
| 4,777,635 A | 10/1988 | Glover | 371/40 |
| 4,835,775 A | 5/1989 | Seroussi | 371/37 |
| 4,873,688 A | 10/1989 | Maki et al. | 371/37.1 |
| 4,937,829 A | 6/1990 | Kadokawa | 371/37.6 |
| 5,140,596 A | 8/1992 | Weldon, Jr. | 371/39.1 |
| 5,170,399 A | 12/1992 | Cameron et al. | 371/37.1 |
| 5,226,043 A | 7/1993 | Pughe, Jr. et al. | 371/40.1 |
| 5,272,661 A | 12/1993 | Raghavan et al. | 364/746.1 |
| 5,323,402 A | 6/1994 | Vaccaro et al. | 371/37.1 |
| 5,375,127 A | 12/1994 | Leak et al. | 371/40.1 |
| 5,384,786 A | 1/1995 | Dudley et al. | 371/37.1 |
| 5,467,360 A | 11/1995 | Lokhoff | |
| 5,469,558 A * | 11/1995 | Lieberman et al. | 710/105 |
| 5,512,853 A | 4/1996 | Ueno et al. | 327/333 |
| 5,581,567 A * | 12/1996 | Chen et al. | 714/758 |
| 5,587,803 A | 12/1996 | Inoue et al. | |
| 5,666,369 A | 9/1997 | Nakamura | 371/37.07 |
| 5,689,452 A | 11/1997 | Cameron | 364/746.1 |
| 5,699,368 A | 12/1997 | Sakai et al. | 371/37.1 |
| 5,719,884 A | 2/1998 | Roth et al. | |
| 5,719,887 A * | 2/1998 | Kazuno | 714/6 |
| 5,754,563 A | 5/1998 | White | 371/376 |
| 5,757,826 A | 5/1998 | Fredrickson | 371/37.11 |
| 5,819,001 A | 10/1998 | Kim et al. | |
| 5,878,058 A | 3/1999 | Im | 371/37.11 |
| 5,974,580 A | 10/1999 | Zook et al. | 714/755 |
| 6,023,782 A | 2/2000 | Cox et al. | 714/784 |
| 6,052,815 A | 4/2000 | Zook | |
| 6,161,209 A | 12/2000 | Moher | |
| 6,289,000 B1 | 9/2001 | Yonge, III | |
| 6,378,100 B1 | 4/2002 | Van Dijk et al. | |
| 6,490,243 B1 * | 12/2002 | Tanaka et al. | 370/216 |

OTHER PUBLICATIONS

Internet Papers: Matache, "Berlekamp's Iterative Algorithm for Finding the Error–Locator Polynomial," http://drake.ee-.washington.edu/~adina/rsc/slide/node8.html.

Internet Papers: Bad, "Overview of Forward Error Correction," http://ee.wpi.edu/courses/ee535/hwk97/hwk4cd97/bad/paper.html; pp. 1–14.

Conference Paper: "Pratical Reed Solomon Design for PLD Architectures" Altera Corporation; http://www.altera.com/html/literature/lconf.html.

International Search Report for International Application No. PCT/US01/18059 filed Jun. 4, 2001, mailed Jun. 25, 2002 (4 pages).

* cited by examiner

PRODUCT CODE BASED FORWARD ERROR CORRECTION SYSTEM

CROSS-REFERENCE FOR RELATED APPLICATION

This application is a continuation-in-part of U.S. application Ser. No. 09/587,150, entitled Product Based Forward Error Correction System, filed Jun. 2, 2000, the disclosure of which is incorporated by reference.

BACKGROUND OF THE INVENTION

The present invention relates generally to forward error correction systems, and in particular to a product code based forward error correction system.

Digital electronic systems store and transmit copious amounts of information. Storage or transmission of digital information sometimes results, however, in corruption of some of the data. Defects in a storage media, or errors in the reading and writing of data from a storage media, may result in data errors. Similarly, transmission of data through a transmission channel may result in errors, through noise in the transmission channel or the inability of the transmitting or receiving unit to properly transmit or read data. As data storage and data transmission may be viewed as transmitting data to a media using a transmitting unit, and thereafter reading the data using a receiving unit, the remaining discussion will be in terms generally of data transmission.

Forward error correction (FEC) is often used to increase data reliability. Generally speaking, FEC systems encode data using an encoder at a transmitter and decode data using a decoder at the receiver. During encoding redundant information is added to the data. The redundant information allows determination by receiving units as to whether data corruption has occurred, and if so, the data that has been corrupted. Thus, the redundant information allows the data to be corrected within limits. The decoder generally decodes the data, generates an error polynomial, and uses the error polynomial to determine corrections to the data.

The encoded data is generally grouped in terms of code words. A code word is comprised of n symbols, of which k symbols are information symbols. The code word therefore contains n-k redundant symbols. The symbols are data words comprised of m bits. In a systematic encoding system, the n-k redundant symbols are appended to the information symbols, while in a non-systematic code the information symbols are also modified. For instance, for BCH codes, $n=2^m-1$ and $k=n-mt$. To correct t bits within the code word, mt bits of overhead/redundancy is needed. Each of the k and n symbols is made of 1 bit. For Reed-Solomon (RS) codes, $n=2^m-1$ and $k=n2t$. For RS codes, to correct t symbols within the code word, 2t symbols of redundancy is needed. Each of the k and n symbols comprise m bits.

In order to increase data transmission reliability increased numbers of redundant symbols are required. The use of additional redundant symbols, however, decreases the effective bandwidth of a transmission system or reduces the total amount of storage space available in a storage system. Moreover, the use of additional redundant symbols increases the amount of processing performed by both the transmitting unit and the receiving unit to create or interpret the redundant symbols.

Moreover, different coding schemes have different abilities to correct different types of errors. For example, errors may be randomly distributed in a data set, or the errors may be grouped together, i.e. be burst errors. Generally speaking, increasing the number of bits within a symbol increases the ability of an FEC system to correct burst errors. However, as indicated above, increasing the number of bits per symbol also increases encoding and decoding circuit size and power requirements since the code word becomes longer.

SUMMARY OF THE INVENTION

The present invention provides a multi-dimensional forward error correction system. In one embodiment the invention comprises an error correction system which decodes code words using a product code. In the product code symbols appear in multiple code words and each code is encoded using an error correction code having an error correction capability. In the embodiment the invention comprises a method of increasing error correction capability, the method comprising determining of plurality of code words which have a number of errors greater than the error correction capability of the error correction code used to encode the code word. The invention further comprises determining symbols common to at least two of the plurality of code words and inverting the common symbols.

In a further embodiment, the invention comprises a method of performing multi-dimensional forward error correction. The method comprises encoding using an error correction code information symbols comprised of input data to form first code words and second code words, the first and second code words sharing at least some symbols. The invention further comprises providing received symbols comprising potentially corrupted symbols of the first code words and second code words to a decoder, the received symbols forming first received symbols and second received symbols sharing at least some symbols. The invention further comprises decoding the first received symbols, including correcting at least some of the potentially corrupted symbols shared with the second received symbols and decoding the second received symbols, the second received symbols including symbols corrected during decoding of the first received symbols, including correcting at least some of the potentially corrupted symbols shared with the first received symbols. The invention further comprises further repetitively decoding the first received symbols and the second received symbols, each decoding using symbols as corrected during previous decoding. Further the invention comprises determining uncorrectable first received symbols and uncorrectable second received symbols in inverting symbols shared by at least one of the uncorrectable first received symbols and at least one of the uncorrectable second received symbols.

In a further embodiment, the present invention comprises a product code based decoding system. The decoding system comprises a memory storing received words and a plurality of decoders. The decoders are configured to receive first dimensioned code words and second dimensioned code words from a memory, and are configured to provide corrected first dimensioned code words and corrected second dimensioned code words to the memory. The decoding system further comprises a memory overwrite circuit, the memory overwrite circuit can figure to track uncorrectable first dimensioned code words and uncorrectable second dimensioned code words into invert symbols common to any one of the uncorrectable first dimensioned code words and any one of the uncorrectable second dimensioned code words.

These and other aspects of the present invention are more readily understood when considered in conjunction with the accompanying drawings and the following detailed description.

DETAILED DESCRIPTION

Figure 1:
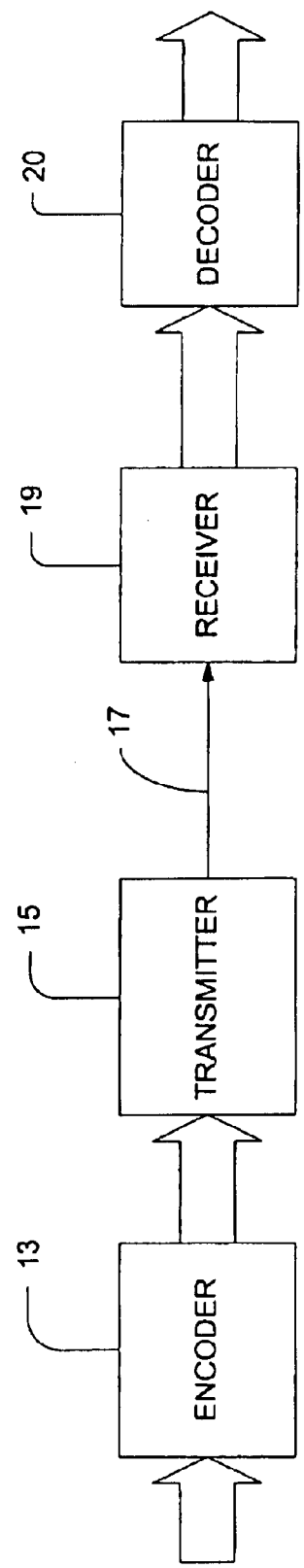
FIG. 1 is a block diagram of a data transmission system in accordance with the present invention.

FIG. 1 illustrates a data transmission system in accordance with the present invention. Data 11 is provided to an encoder 13. The encoder forms information words from the data and multiplies the information words by a generator matrix to form a code word. In an alternate embodiment the remainder is computed when the information vector is divided by the generator polynomial as the remainder is subsequently added to the original information vector to form the code word. As discussed below, the encoder performs multidimensional encoding. In the embodiment described the code is a (255, 239) Bose-Chaudhuri-Hocquenghem (BCH) code. Each symbol is one bit, and the code word is 239 information bits and 16 redundant bits. Further, the code is a (255, 239) BCH product code. In another embodiment the code is a nonlinear product code, and in a further embodiment the code is a convolutional product code.

Figure 2:
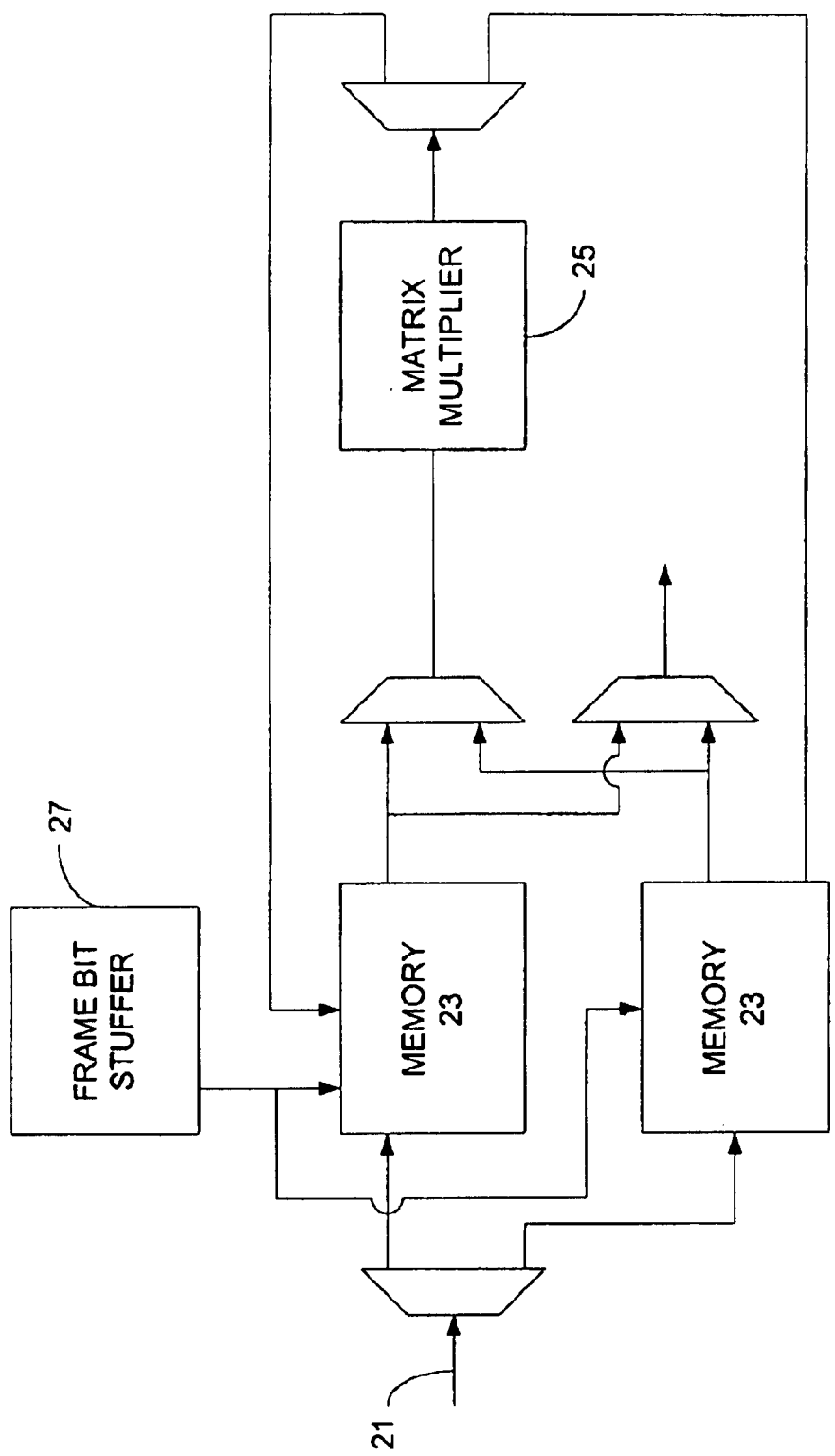
FIG. 2 is a block diagram of an encoder including memory of the system of FIG. 1.

FIG. 2 illustrates additional features of an encoder and associated memory in accordance with the present invention. Incoming data 21 is provided to a memory 23. The memories each store 255×255 bits. Each memory is a dual port memory so that information may be simultaneously written into the memory and read from the memory. In one embodiment, and as illustrated in FIG. 2, two memories are used. The use of two memories allows one memory to be filled with incoming data while operations are performed on data in the other memory. Accordingly, and as illustrated in FIG. 2 using a demultiplexer, the incoming data is selectively provided to one of the two memories. Further discussion of FIG. 2 will be in terms of use of one of the memories, although those of skill in the art will realize the applicability to two memories based on the configuration illustrated in FIG. 2.

The memory stores the incoming data in virtual rows and columns such that the information is stored as a virtual 239×239-bit block of data, which may be considered a page of data. The first bit is stored in the first virtual row and column, and subsequent bits are stored in the first virtual row in subsequent virtual columns until 239 virtual columns of the first virtual row is full. The subsequent virtual rows are then filled in a like manner. In alternate embodiments, the data is assembled in a columnar fashion, where the first bit is stored in the first virtual row and column, and subsequent bits are stored in the first virtual column in subsequent virtual rows until 239 virtual rows of the first virtual column are full. In another alternate embodiment data is assembled in a totally disbursed method throughout the 239×239 matrix. In the above data assemblies, the data is assembled in a known, pre-identified manner.

The data comprising the information vector is provided to a matrix multiplier 25, first by row and then by column. Thus, 239 bits of data from the first row are provided to the matrix multiplier, which calculates 16 redundant bits. The resulting 16 bits are stored in the memory in the same virtual row as the 239 bits upon which they are based. The matrix multiplier encoder processes the incoming data row by row until 239 rows are processed. As each row is processed the 16 redundant bits are stored in the same virtual memory row as the 239 bits upon which the 16 redundant bits are based.

In one embodiment, matrix multiplication is accomplished as is generally known in the art. For example, in one embodiment data is provided sequentially to a series of summers and registers, with feedback to Galois field multipliers whose outputs are also provided to the summers. In another embodiment matrix multiplication is performed in a semi-parallel fashion. Semi-parallel matrix multiplication is discussed in the commonly assigned U.S. patent application entitled "Reed-Solomon Encoder and Decoder, filed on even date herewith, the disclosure of which is incorporated by reference herein.

The encoder performs column encoding once row encoding has been performed. Accordingly, the 239 bits of information from each column are provided to the matrix multiplier to form redundant column bits. The redundant column bits are then stored in the memory in the same virtual column as the 239 column bits. As the redundant row bits also form columns, the redundant row bits are also encoded. Thus, a total of 255 columns are encoded.

Figure 3:
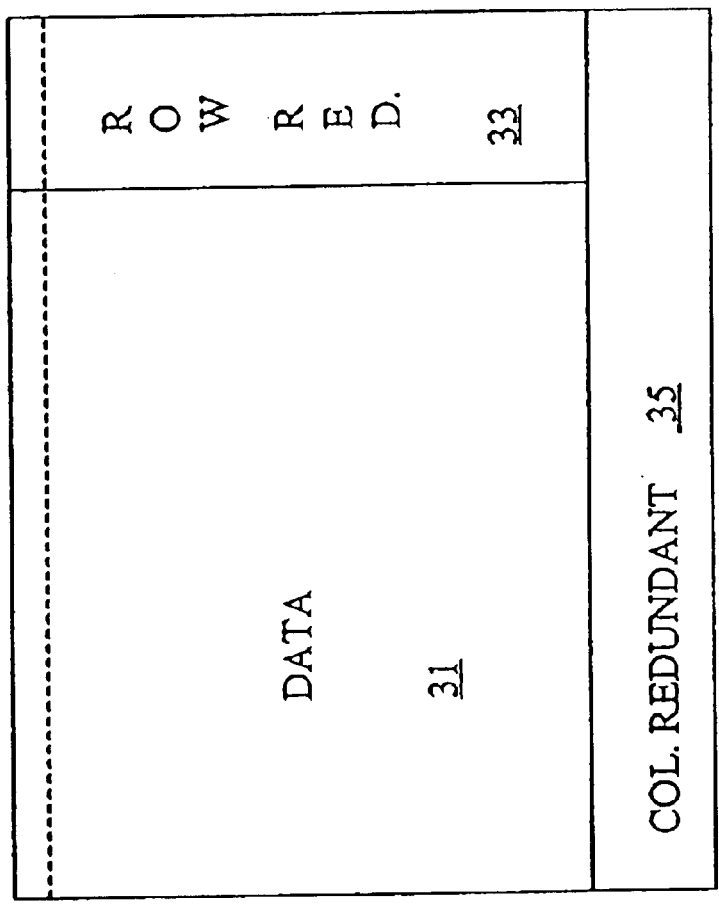
FIG. 3 illustrates a data block used in operation of the system of FIG. 1.

FIG. 3 illustrates a data block resulting from the operations described with respect to FIG. 2. As illustrated in FIG. 3, a data payload 31 is formed of a block of 239×239 bits. A row redundant bits blocks 33 occupies columns 240–255 down to and including row 239. A column redundant bits block occupies rows 240–255. In this illustration, row encode is first performed followed by column encode. An alternate technique is to perform column encode first followed by row encode.

The data and redundant bits in the memory of FIG. 2 are provided to a transmitting unit 15 (shown in FIG. 1). The data and redundant bits are provided in a pre-identified order, which in the embodiment currently described is the same order as in which data is loaded, namely row by row. It should be recognized, of course, that whereas data is loaded into memory in rows of 239, data is read out of memory in 255 rows each having 255 bits.

Returning now to FIG. 1, the transmitting unit transmits the data over a transmission media 17 to a receiving unit 19. As should be recognized, the data transmitted by the transmitter is comprised of code words, as opposed to the information words provided to the encoder. The receiving unit receives data from the transmission media. The data received by the transmitting unit is comprised of received words, which are the code words potentially corrupted by errors. The receiving unit provides the received data to a decoder 20. The decoder decodes the received words and corrects, within limits, errors in the received words.

In some embodiments the receiving unit also frames the received data. The decoder expects to decode and correct received words, and therefore expects to be provided received words in a manner known to indicate received word boundaries. Framing is therefore accomplished by the receiving unit to indicate received word boundaries for each page of received words. In one embodiment framing is accomplished by inserting a known number of framing bits having a known pattern in the transmission signal at the transmitting unit, and locating the framing bits using the receiving unit. The framing bits are thereafter removed at the receiving unit.

In an alternate embodiment data is provided to the decoder prior to framing. During normal system operation a number of rows and/or columns may be expected to have no errors. In such a situation the syndrome words generated by a syndrome generator of the decoder are zero. Accordingly, in the alternate embodiment framing is accomplished by providing the data stream to the decoder and checking for syndrome words equal to zero. In further alternative embodiments framing is accomplished using conventional methods, or those described herein, and checking of the syndrome words is done as a check for a false framing lock.

In the present embodiment, however, framing bits are inserted into a page of data and transmitted with the page of data. In particular framing bits are inserted into a row, when transmission is by row, or into a column, when transmission is by column. Thus, and as illustrated in FIG. 2, a frame bit stuffer 27 inserts frame alignment bits into a predefined row, such as row 239, of the memory. The framing bits are then utilized by the receiver to perform framing functions. The framing bits are, so far as the decoder is concerned, merely portions of the encoded data for which decoding is desired.

Figure 4:
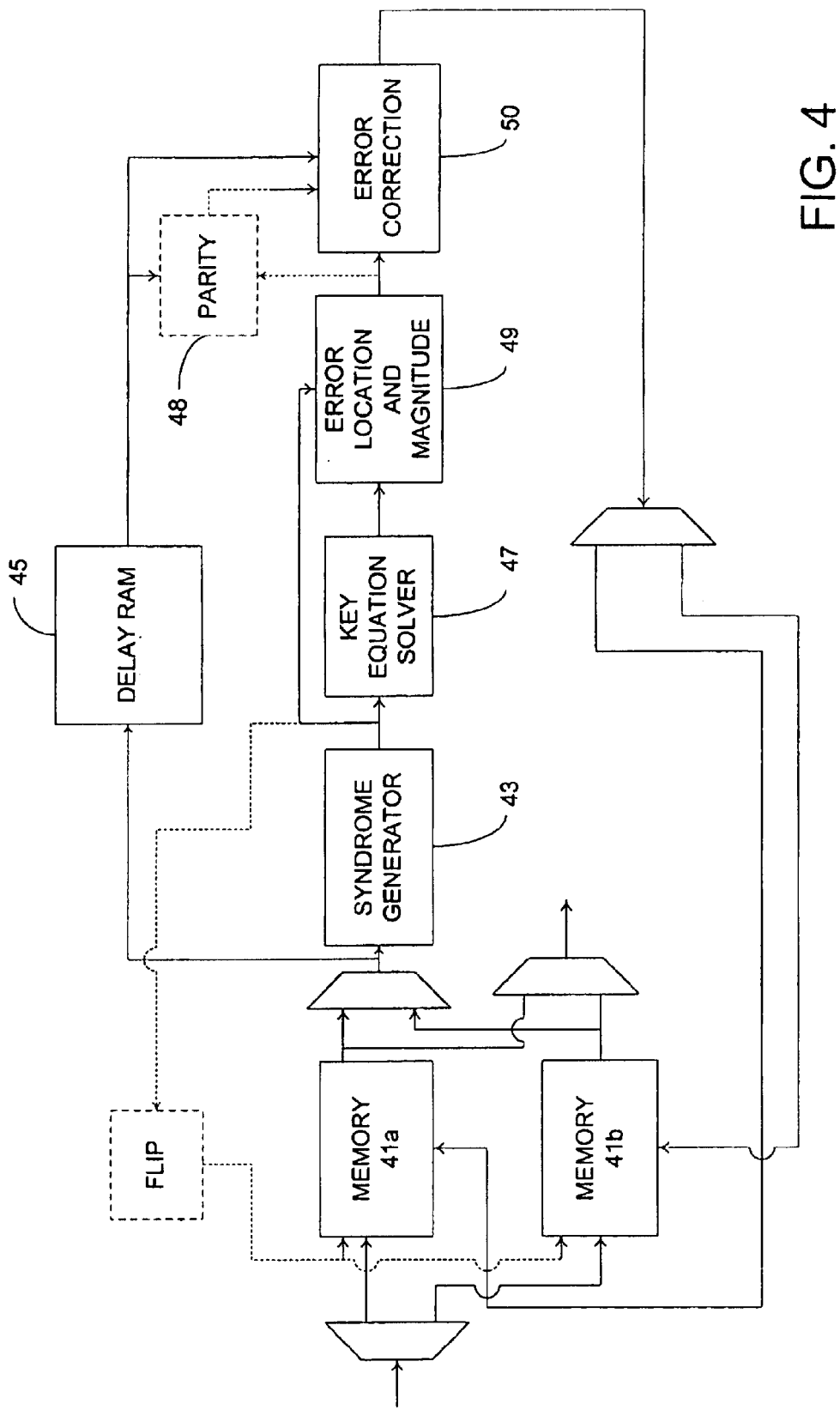
FIG. 4 illustrates a decoder including memory for the system of FIG. 1.

FIG. 4 illustrates a decoder in accordance with the present invention. As illustrated, the decoder includes two 255×255 memories 41a,b. As discussed with respect to the encoder, two pages of memory are provided. Use of the two pages of memory allows one page to receive data while processing of data loaded in the other page occurs. It should be also recognized, however, that in other embodiments, and for decoders in general, the memory may be not considered part of the decoder itself. The memory stores the received data in the same pre-identified order as data is stored the memory of the encoder. Accordingly, the memory of the decoder stores the data row by row.

The received words are thereafter provided both to a syndrome generator 43 and a delay RAM 45. The syndrome generator generates syndrome words that are provided to a key equation solver 47 and an error location and magnitude unit 49. The key equation solver generates an error polynomial which is also provided to the error location and magnitude unit. The error location and magnitude unit locates errors and magnitudes of the errors and provides this information to an error correction block 50. For BCH codes, the computation of the magnitude of the errors is not required since each symbol is made of only 1 bit and the error correction is achieved by taking inversion of the bit at the appropriate error locations. The error correction block also receives the received data from the delay RAM, and outputs corrected data. The corrected data is provided to the memory, and overwrites the uncorrected data. Thus, for example, row x may have contained y errors prior to correction. The corrected data for row x, however, contains fewer than y errors, and so the corrected data is written in place of the uncorrected data.

Figure 5:
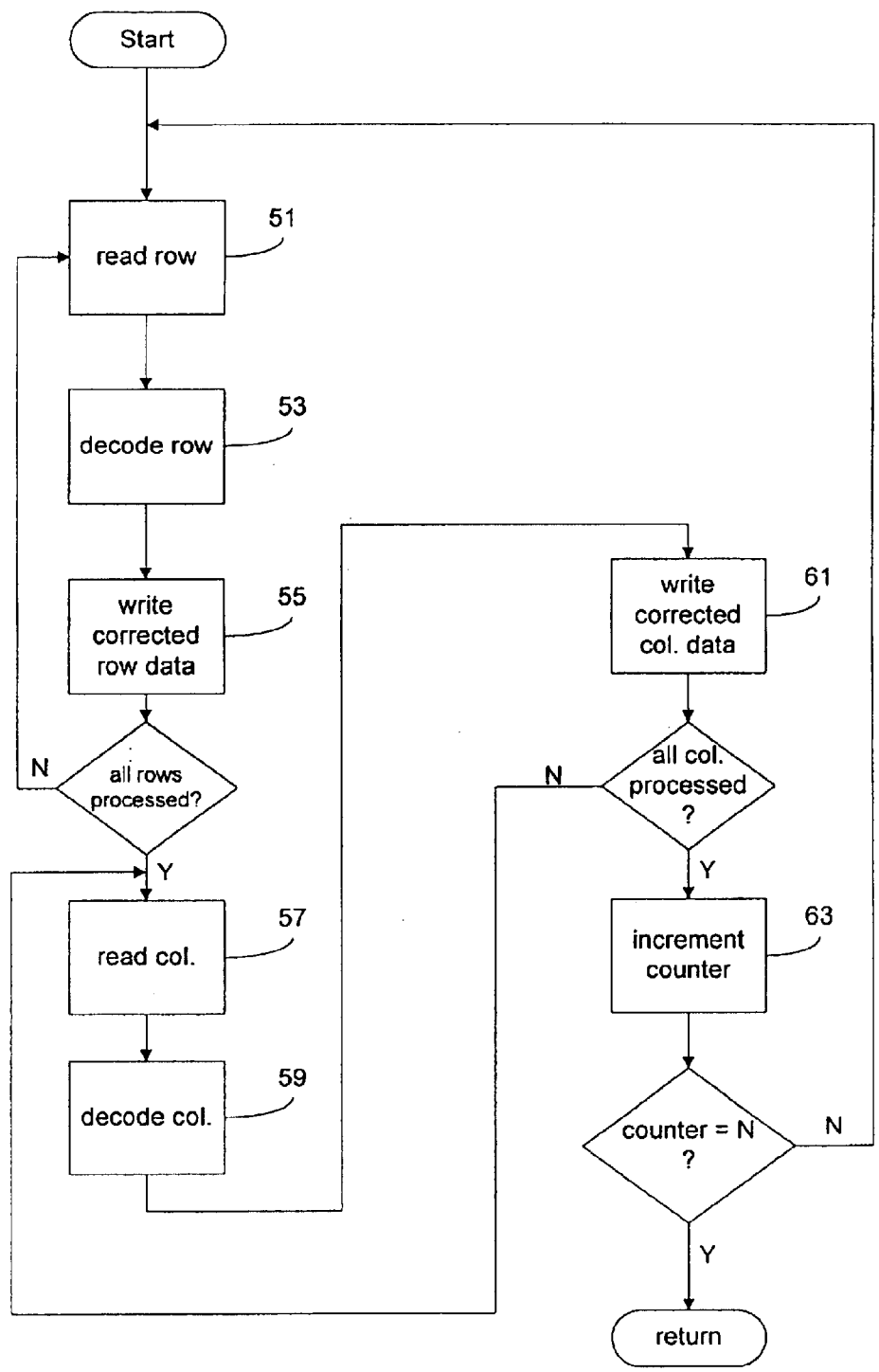
FIG. 5 is a flow diagram of a process implemented by the decoder of FIG. 4.

FIG. 5 illustrates a flow chart of a process for correcting errors in the received data. In step 51 row data is read sequentially from the memory. Each row comprises 255 bits, as previously described. The row data is provided to an error decoder. In step 53, the decoder decodes the code word as previously described. More specifically, the decoder decodes the code word by first generating syndrome words, and providing the syndrome words to a key equation solver. The key equation solver creates an error polynomial which is processed, along with the syndrome words, by a location error magnitude block to create an error vector. The error vector is provided to the error correction and error monitor block, which is also provided the received data from a delay RAM, and outputs corrected information.

After each row is corrected, to create corrected row data, the corrected row data is written into the memory in place of the row data in step 55. The corrected row data, however, may have contained a greater number of errors than are correctable using the (255, 239) BCH code. Accordingly, after the rows have been corrected, the process begins correcting column data. The column data is therefore read out of the memory in step 57 and provided to the decoder. The decoder then corrects the column data in step 59. The corrected column data is written into the memory in step 61.

After the column data has been corrected, the process increments a counter in step 63. If the counter is equal to N the process returns. For different error rates, different number of process returns may be used. In the embodiment described N is equal to eight. If the counter is less than eight, the process returns to step 51 and reads row data from memory and thereafter corrects the row data. The process then reads column data and corrects column data, and repeats until the counter reaches eight. The purpose of the multiple passes of reading row data and column data is that rows and/or columns containing otherwise uncorrectable data may have had the number of errors reduced by prior corrections of column and/or rows such that an uncorrectable row or column is now correctable. Thus, the multiple passes through the data provides for increased error correction capability. In addition, applicants have found that eight passes for (255, 239) BCH product code provides suitable error correction capability, namely the capability to correct a $5*10^{-3}$ bit error rate (BER) to a $10^{-15}$ BER.

Use of the methods previously described, however, may be insufficient to correct errors in some circumstances. For example, a number of errors that exceed the error correction capability of the code may exist in intersecting rows and columns of code words. For the previously described BCH code this may occur when three rows each have errors in the same three columns. Such a block of errors prevents correction of any of the errors as previously described through either row correction or column correction.

Figure 17:
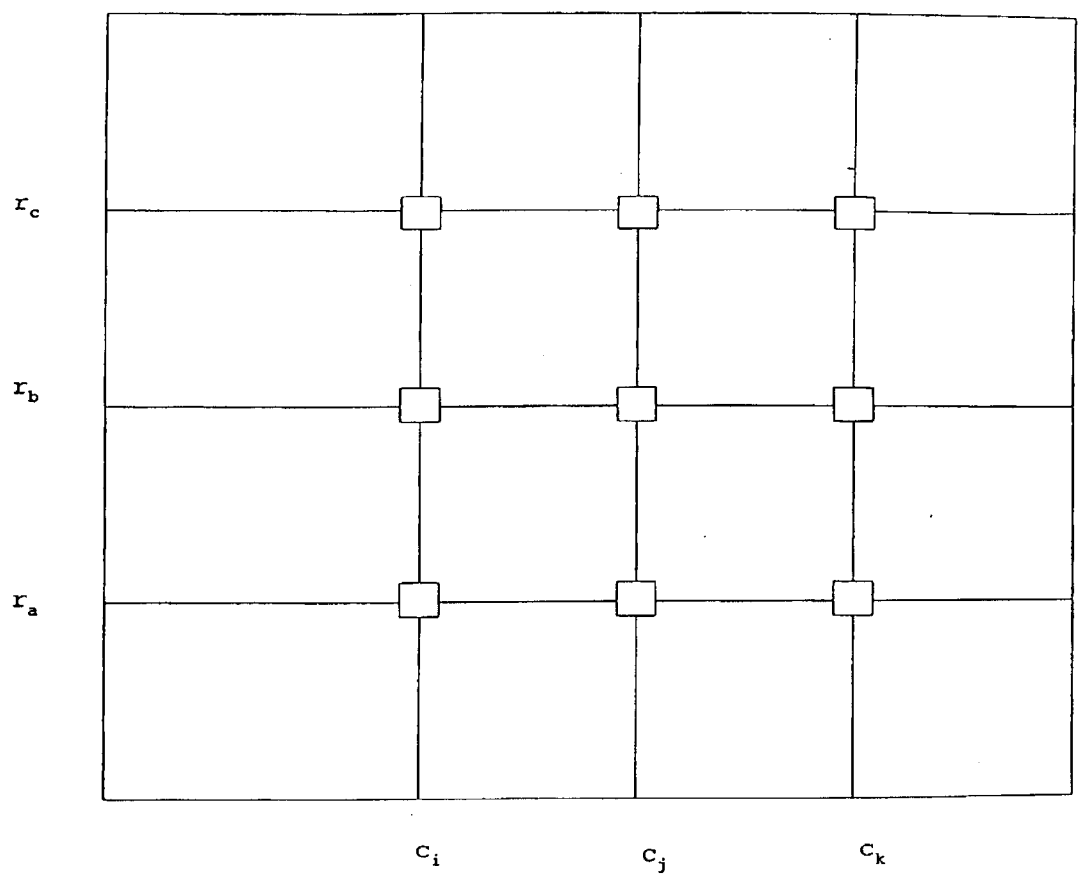
FIG. 17 illustrates a data block with errors exceeding a correction capability of a code.

An example of intersecting errors that exceed the error correction capability of a code is shown in FIG. 17. FIG. 17 illustrates a data block having a plurality of rows and a plurality of columns. Three of the rows, rows, $r_a$, $r_b$ and $r_c$, each have errors in the i, j, and k positions. Accordingly, each of the columns $c_i$, $c_j$, and $C_k$ also have three errors, with the errors in the a, b, and c positions. These errors are not correctable simply using row and column decoding of the data block encoded using the (255, 239) BCH code as the three errors per row or column exceeds the two bit error correction capability of the code.

In one embodiment therefore further corrections are performed when the presence of intersecting uncorrectable rows and columns is detected. The corrections are accomplished by detecting a number of uncorrectable rows and uncorrectable columns, with the number of rows and columns each exceeding the error correction capability of the code.

Returning to the decoder including memory of FIG. 4, a flip block is optionally included in the design. The flip block is provided the syndrome from the syndrome generator 43 as well as an indication of the associated row or column. The syndrome provides the flip block with information regarding the number of errors in a row or column. The flip block maintains a record of the rows and columns containing an uncorrectable number of errors.

In an alternate embodiment, the flip block receives information as to when a row or column has an uncorrectable number of errors from the error correction block. This allows the flip block to take account of processing associated with the parity block, which is later described.

Figure 18:
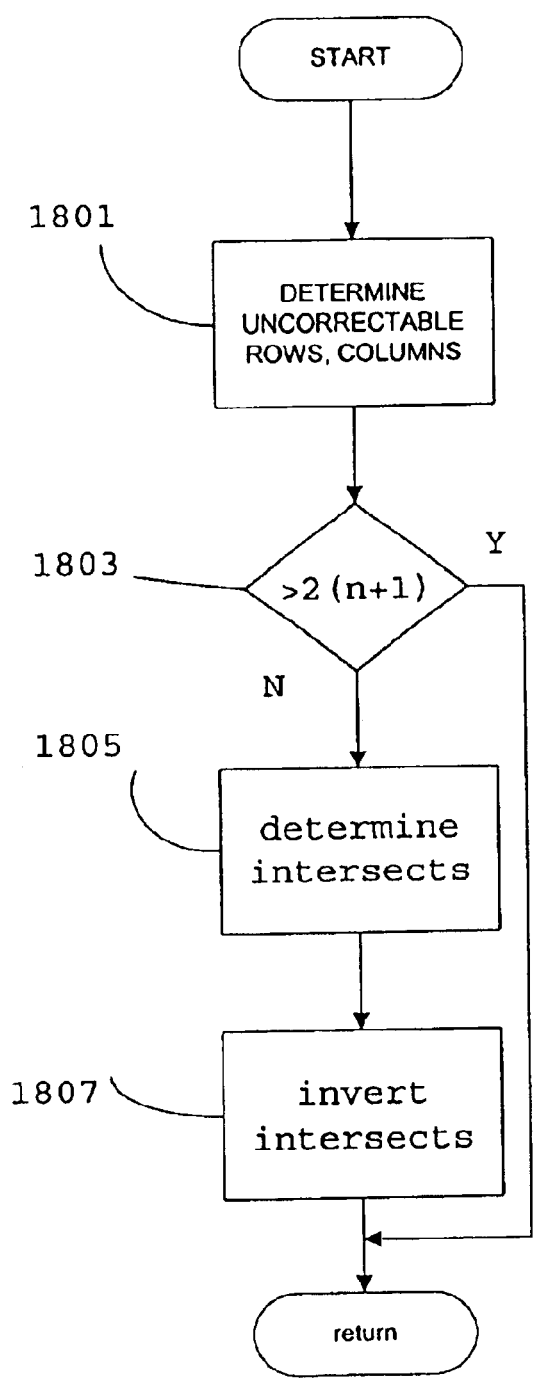
FIG. 18 is a flow diagram of a process for correcting uncorrectable code words.

In one embodiment the flip block commands bit corrections, in some embodiments by overwriting data in the memory, after $N_1$ passes of corrections of rows and columns. Accordingly, in one embodiment after checking if all columns are processed after performing the operations of block 61 of FIG. 5, but before beginning of the operation of block 63 if FIG. 5, additional processing occurs. A flow chart of a process performing this processing is illustrated in FIG. 18. In block 1801 the process determines the number of rows and columns having uncorrectable errors. In block 1803 the process determines if the number of uncorrectable rows and columns each equals or exceeds 2(n+1), where n is the error correction capability of the code and the processing is for a two-dimensional code. If the uncorrectable number of rows and columns each equals or exceeds 2(n+1) the process returns.

In block 1805 the process determines the memory locations of the bits of the intersections of the uncorrectable rows and columns. In block 1807 the process inverts the memory locations of these bits, i.e., 1 bits are changed to 0 bits and 0 bits are changed to 1 bits. In one embodiment this is accomplished, for example, by reading the bits and forming replacement bits by providing the bits to an AND gate, with the output of the AND gate providing the replacement bit. The process thereafter returns.

In another embodiment, additional memory elements are used to store the data. Thus, in the additional embodiment, a first memory is used to hold the uncorrected data, and a second memory is used to hold the data corrected by row. Data further corrected by column is stored in yet an additional memory. In such an embodiment, however, additional layout space for additional memory cells is required.

In order to further increase burst error correction capability for the above-described system, in one embodiment transmission of data is done on an interleaved basis. In one embodiment this is accomplished using four encoders each having their own input data stream. Data from the two encoders is interleaved bit by bit prior to transmission. Similarly, after reception the received data is de-interleaved and provided to four separate decoders. In such a system any burst error occurring during transmission is distributed among different block codes, thereby decreasing the effect of the burst error on any one block. In other embodiments the burst error correction is altered by changing the number of interleaved frames. In addition, there are other ways to perform the interleave other than simple bit by bit. Other embodiments interleave a byte of data from each interleaved page, or interleave a whole column or row from each page.

Figure 6:
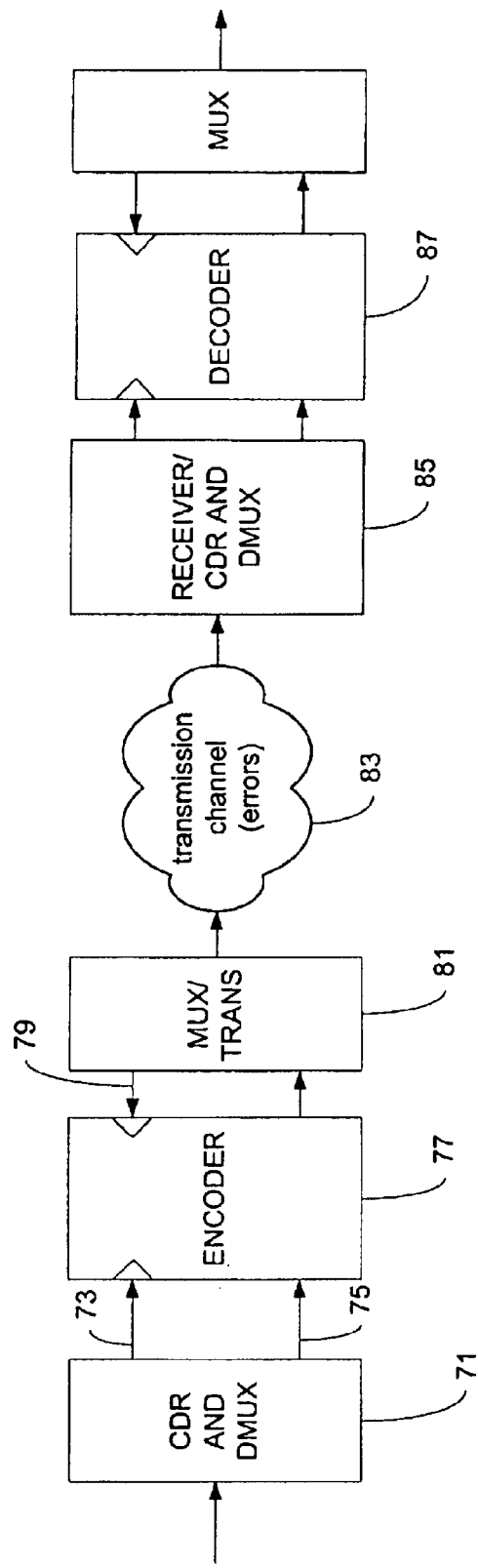
FIG. 6 is a block diagram of a further data transmission system in accordance with the present invention.

FIG. 6 illustrates a further embodiment in accordance with the present invention. Serial data is provided to a clock and data recovery (CDR) and demultiplexer unit 71. The CDR reads the input data and extracts a clock signal from the input data. The clock signal is used to recover the serial data. The serial data is then parallelized by the demultiplexer to form parallel data. A multiple of the extracted clock signal 73 and parallel data 75 are output from the CDR and demultiplexer. An encoder 77 receives the clock signal and the parallel data. The encoder also receives a clock signal 79 from a multiplexer associated with a transmitter (together 81). This is further described later, but the purpose of the clock signal from the transmitter multiplexer is to allow data to be clocked out of the encoder at a faster rate than data is clocked into the encoder.

Figure 7:
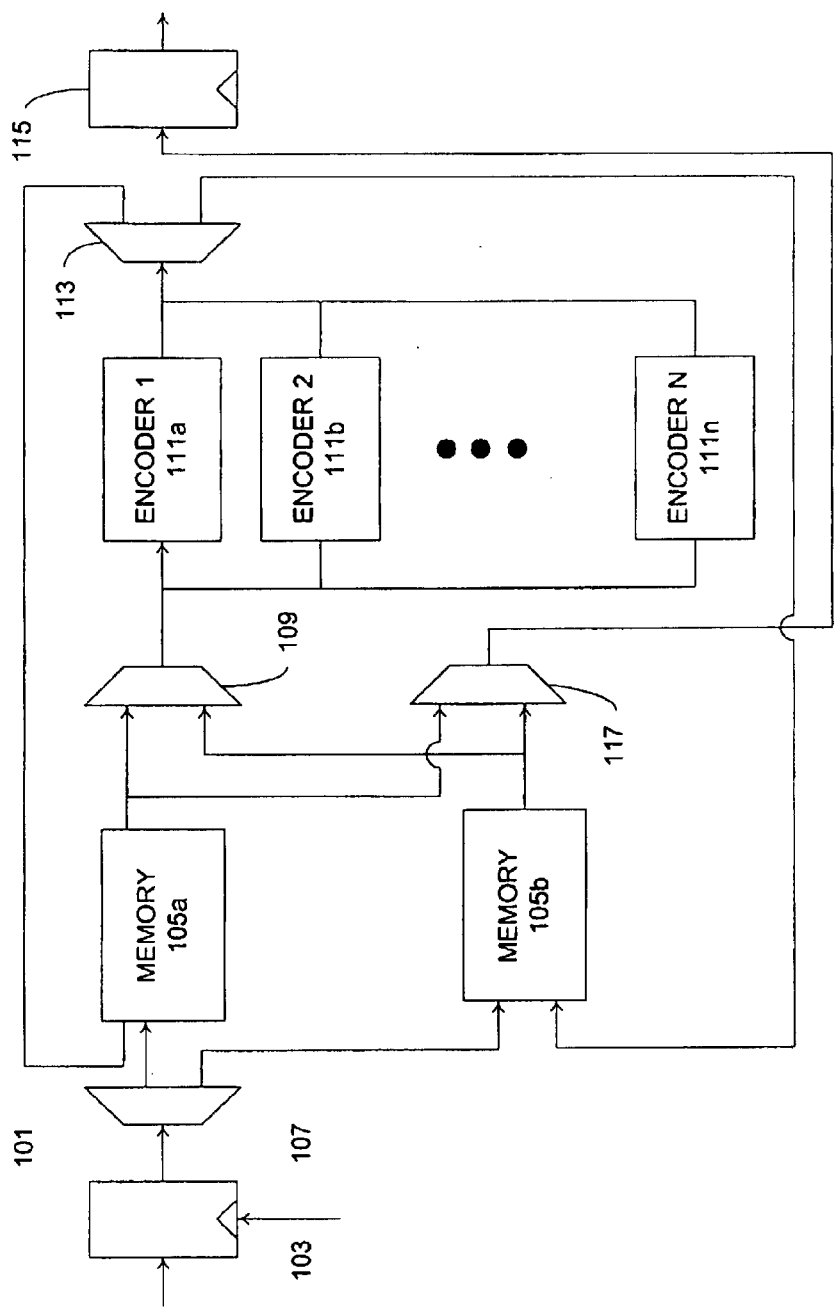
FIG. 7 is a block diagram of an encoder including memories for use in the system of FIG. 6.

FIG. 7 illustrates an encoder for use in the system of FIG. 6 in accordance with the present invention. The encoder stores the parallel input data in a first set of registers 101 (of which a representative one is shown). The first set of registers is clocked using a clock signal 103, which is a divide of the clock signal extracted from the serial data. The data in the first set of registers is passed to one of two memories 105a,b, the selection of the memory being controlled by a demultiplexer 107. The demultiplexer is used to first fill one memory, and then fill the other memory. Two memories are used so that while data in one memory is processed by the encoder, the other memory may receive further data.

Each of the memories comprises a 256 bit by 256-bit memory. The 256 bit by 256 bit memories are used in a manner as previously described with respect to FIG. 3, with some additional features. A 256 bit by 256 bit memory block is convenient in that data transmission and other operations are often accomplished on a byte of data, and 256 is divisible by 8. In addition, the addition of the extra bit in both row and column allows additional overhead that can be used for framing, i.e. insertion of a frame alignment word (FAW), incorporating parity checks or providing for channel overhead.

Figure 8:
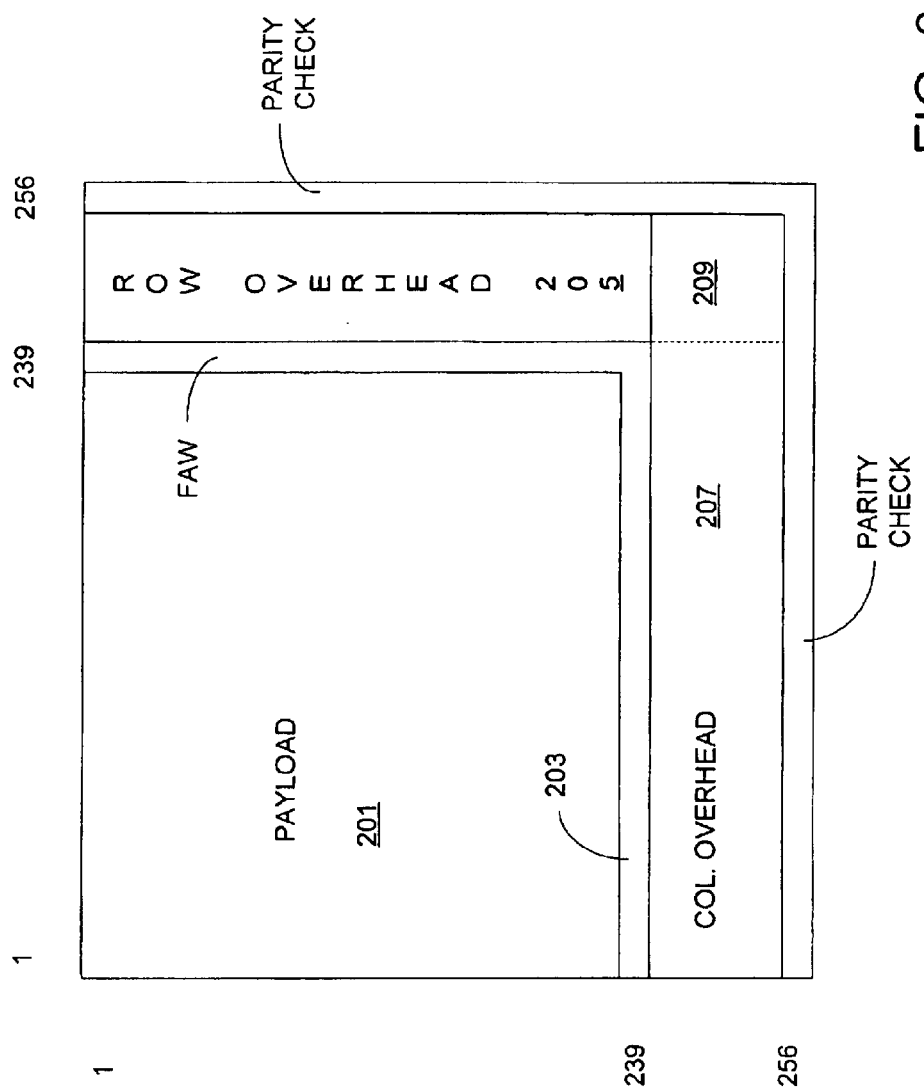
FIG. 8 is a data block used with the data transmission system of FIG. 6.

FIG. 8 more fully illustrates a data block formed using the 256×256-bit memory. The data block is 256 bits by 256 bits. A first block 201 of the data block is 238 bits by 238 bits, and forms a data payload. The 238 by 238 bit block therefore is used to identify data transmitted over the transmission medium. The bits 203 in the 239th row extending to the 239th column are reserved for optical channel overhead. The 239th column, extending to the 239th row, is allocated for a FAW. The columns 205 from bit 240 to bit 255, and extending to row 240, contain row overhead information. The row overhead information contains redundant bits generated during encoding prior to transmission. Similarly, the rows 207 from bit rows 240 through 255 contain column overhead, namely, redundant bits also added during encoding operations. Thus, for example, in the second row, bits 1 through 238 are data representing transmitted information, bit 239 is part of the FAW, and bits 240 through 255 are redundant bits added for error correcting purposes. Bit 256 is allocated for parity check purposes. Likewise, using column 2 as an example, bits 1 through 238 include transmitted data, bit 239 includes optical channel overhead, and bits 240 through 255 are error correction bits added during coding. Bit 256 is allocated for parity check purposes.

In one embodiment, the bits 209 beginning at row 240 and column 240 and greater serve no purpose. This is because in the one embodiment row overhead encoding and column overhead encoding occur simultaneously in parallel. In the described embodiment, however, encoding is a two step process. In a first pass, the payload, including the optical general overhead, is encoded to created row overhead. The payload and the row overhead are thereafter encoded to create column overhead. As is further described, encoding the row overhead is beneficial in that it allows the row overhead to be corrected using the redundant bits added by the column overhead.

The parity check bit indicates the parity of the 255-bit row or column with which the parity check bit is associated. The parity check bit is used to resolve otherwise unresolvable errors. In the embodiment described, for example, a (255, 239) BCH code is used. A (255, 239) BCH code is able to locate and correct up to two bits out of every 239 bits. If two or more bits have errors the resulting error polynomial on decoding is a second order polynomial. In the presence of three or more errors the location of errors may or may not be correct. Accordingly, the parity check bit is used to provide a further indication as to the errors if more than two errors are indicated.

For example, in one embodiment as shown in FIG. 4, a parity circuit 48 receives the code word from the delay RAM and the error locator polynomial from the error location and magnitude unit. Decoding may result in a second order error locator polynomial, but potentially three bits having errors. If the parity bit indicates even parity, and the actual parity is odd, then three or greater odd number of errors are in the data and the parity circuit provides the error correction unit a do not correct signal. Modification of the bits indicated as error is then disabled by the error correction unit. Thus, in one embodiment, a parity check circuit compares the parity bit with the parity of the received word. If the parity bit does not match the parity of the received word and the error locator polynomial is of degree one, the parity circuit directs the error corrector to correct, i.e. change the bits indicated as potential error bits. If, however, the parity bits does not match the parity of the received word and the error locator polynomial is degree two, the parity circuit directs the error corrector to disable corrections.

Figure 19:
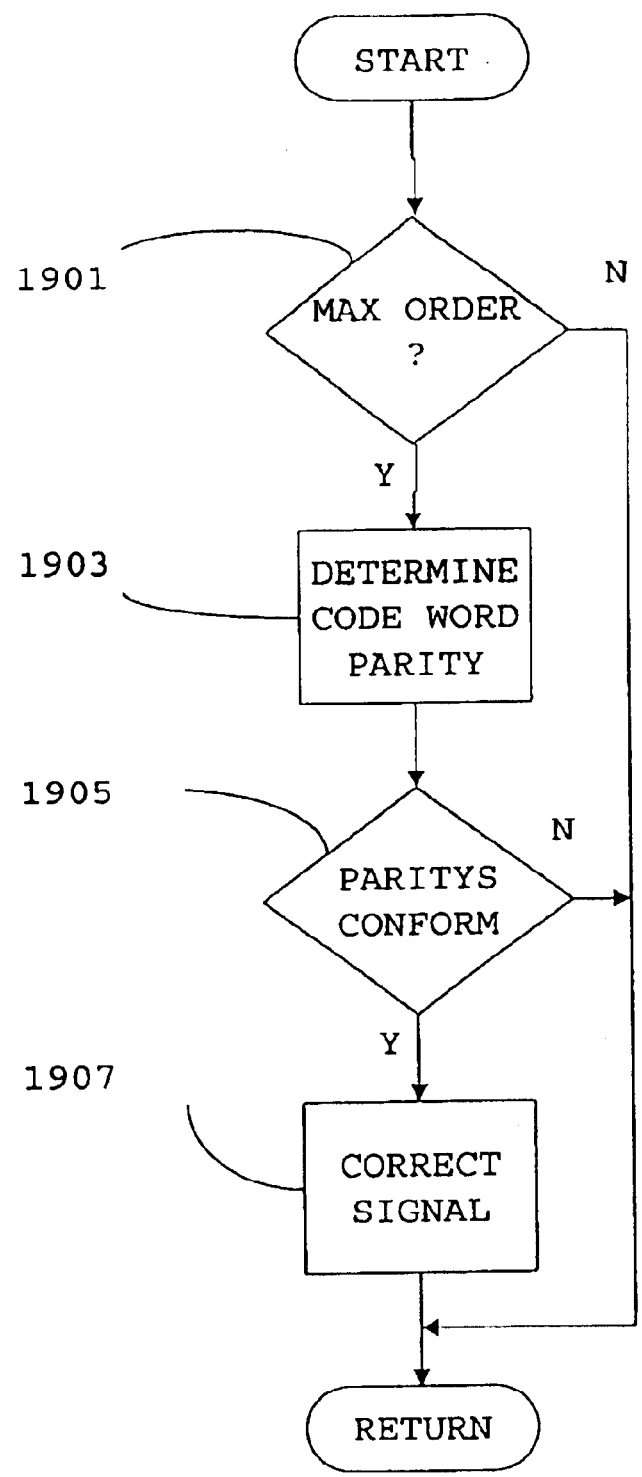
FIG. 19 is a flow diagram of a process for generating an error correction signal using a parity evaluation.

Thus, in one embodiment the parity block forms a correct signal, or do not correct signal, in accordance with a process as illustrated in FIG. 19. In Block 1901 the process determines if the error polynomial is of maximum order. For example, the BCH code previously described is able to correct 0, 1, or 2 errors, and the error polynomial will be either zero order, first order, or second order, respectively. The error polynomial, however, at a maximum will be second order, even in the presence of three or more errors.

If the error polynomial is not of maximum order the process returns. Otherwise the process continues to Block 1903 and determines the parity of the received code word. In Block 1905 the parity of the received code word is compared with the parity bit. If the parity of the received code word, the parity bit, and the maximum order of the error polynomial conform then a correct signal is generated in Block 1907. If the parity of the received code word, the parity bit, and the maximum order of the error polynomial do not conform then a do not correct signal is generated. The process thereafter returns.

An example of determining conformance using the previously described BCH code is instructive. The previously described BCH code has an error polynomial maximum order of 2, which is even. If the parity of the received code word and the parity bit match, that is are either both odd or both even, then the error polynomial maximum order, the parity of the received code word, and the parity bit conform. If, however, the parity of the received code word and the parity bit do not match, then the code word has an odd number of errors. The odd number of errors does not conform with the indication provided by the error polynomial, and the error polynomial maximum order, the parity of the received code word, and the parity bit do not match.

Returning now to FIG. 7, the memories are coupled, as illustrated, by a multiplexer 109 to N encoders 111*a–n*. The output of the encoders are in turn coupled by a demultiplexer 113 to the memories. Thus, in one embodiment, for example, 256 encoders are provided, with each encoder processing, i.e. performing Galois field multiplication, one row or column in parallel (14 of the encoders during row processing would in fact be operating on dummy characters). In the embodiment of FIG. 7, however, a semi-parallel implementation is used, and 256 encoders are provided. Each of the encoders is provided one byte at a time, with each byte coming from a single row. Each encoder continues to read bytes from the same row until the entire row has been encoded. As previously described with respect to FIG. 5, encoding occurs first for rows, and then proceeds to columns. As each row or column is encoded the redundant byte are supplied to the memory in the appropriate row or column.

During encoding of a first memory block, the second memory block is filled with incoming data. Accordingly, one memory block is filled with incoming data while the other memory block is being encoded. Beneficially the number of encoders, and the speed of operation thereof, is determined to ensure that at expected input data rates the encoding process is substantially able to occur within the time required to fill a memory block.

Once encoding for a memory block is complete, the contents of the memory are provided through a multiplexer 117 to a set of output registers 115 (of which a representative one is shown). The contents of the memory are provided to the output registers in a predefined order. In the embodiment currently described the contents of the memory are provided by column, namely first column 1 is provided, then column 2, and so on until 256 columns are provided. The set of output registers are clocked at a rate set by the transmitting unit. The rate of the transmitting unit is generally higher than the received rate of data. This is because data is clocked out by the transmitting unit faster than data is received by the CDR and multiplexer to account for the additional overhead bits being provided during encoding.

Returning now to FIG. 6, data from the encoder is provided to the multiplexer and transmitting unit 81. The multiplexer serializes the data received from the encoder, specifically the memory of the encoder. The transmitter transmits the data over a transmission channel 83.

A receiving unit 85 at the other end of the transmission channel receives the transmitted data, which has been potentially corrupted during transmission. The receiving unit includes a clock and data recovery unit and demultiplexer.

The clock and data recovery unit and demultiplexer of the receiver is substantially described with respect to the transmitter. The CDR and demultiplexer therefore provide a clock signal and parallel data to a decoder 87.

The receiving unit also performs framing of the received data. As mentioned above, the contents of the memory of the encoder are provided to the transmitter, and transmitted column by column. Also as discussed above, the 239th column is allocated for framing bits. The framing bits therefore are transmitted in consecutive fashion and form a bit pattern. The bit pattern forms frame alignment words (FAW).

Upon reception, the receiver frames by searching the received data for portions of the FAW. During transmission bits of the FAW may become corrupted. For example, a transmission line having a BER of $1.2 \times 10^{-2}$ may result, on average, in 0.6 errors every 48 bits. As 48 bits are often used to form a FAW in robust framing, transmission errors may result in an appreciable number of 48 bit FAWs being missed.

Accordingly, in the present invention FAW words are considered detected when a significant portion of a FAW is detected. In the described embodiment, with a 48 bit FAW, a FAW is considered detected when 45 bits of the 48 bit FAW are detected. This allows for detection of FAWs with errors four standard deviations from the mean.

Figure 11:
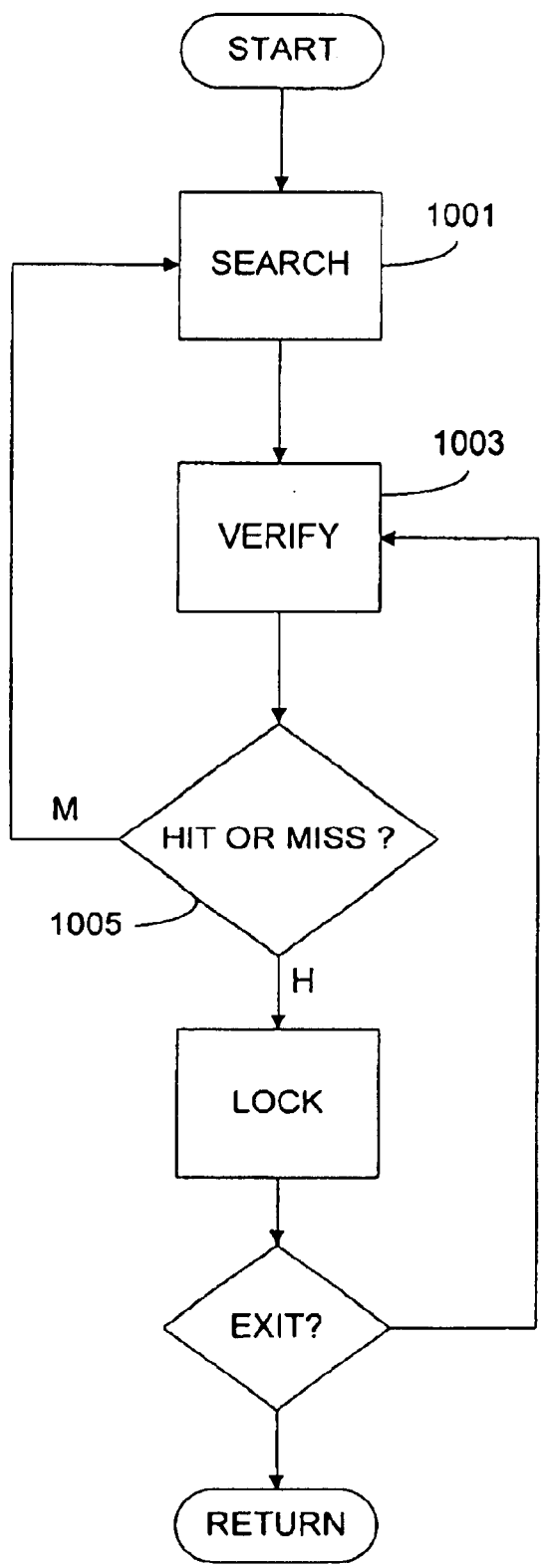
FIG. 11 is a flow diagram of a framing process in accordance with the present invention.

FIG. 11 is a flow chart of a process for implementing framing for 45 of 48 bits of a FAW. Although FIG. 11 is in terms of a process, those of skill in the art will recognize that, particularly for a transmission system, the process is implemented as hardware circuitry. The hardware circuitry is implemented through synthesis of a hardware design language such as HDL, VHDL or the like, description of the process of FIG. 11.

Figure 12:
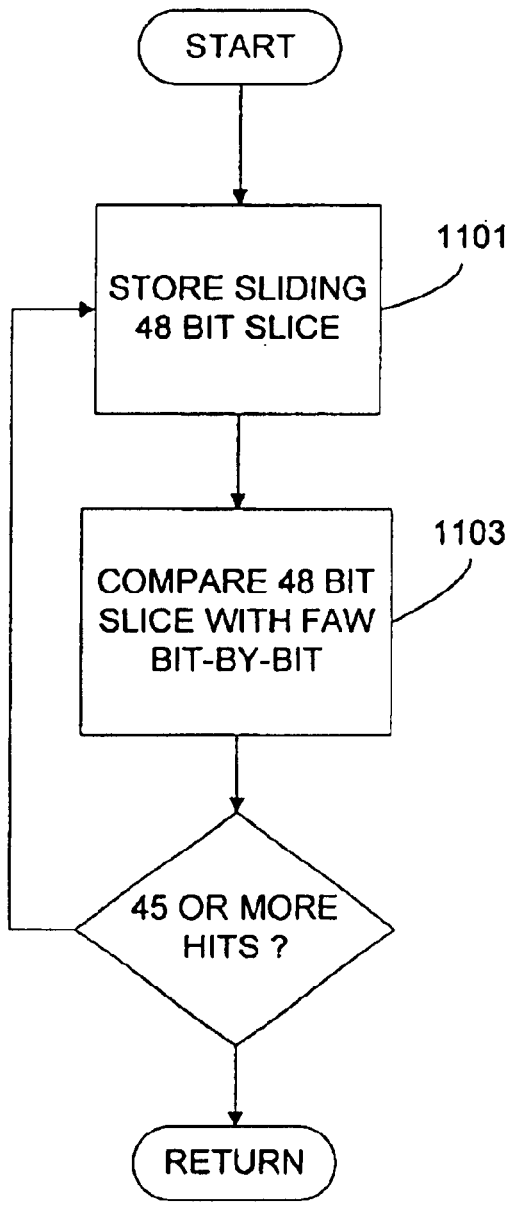
FIGS. 12–14 are flow diagrams of subprocesses of the framing process.

As shown in FIG. 11, in block 1001 a search is performed. A search is performed until 45 bits of a 48-bit slice are determined to match the FAW. The process for accomplishing this is illustrated in FIG. 12. As illustrated in FIG. 12, a sliding 48-bit slice of data is stored (1101). The 48-bit slice is compared with the FAW bit by bit (1103). If less than 45 of the 48 bits match the FAW, the next incoming bit is added to the 48 bit slice, and the oldest bit of the 48 bits is removed from the 48 bit slice, thus a sliding 48 bit slice is stored again. The new 48-bit slice is thereafter once again compared bit by bit with the FAW. Once the 48-bit slice matches at least 45 bits of the FAW, the process returns.

Figure 13:
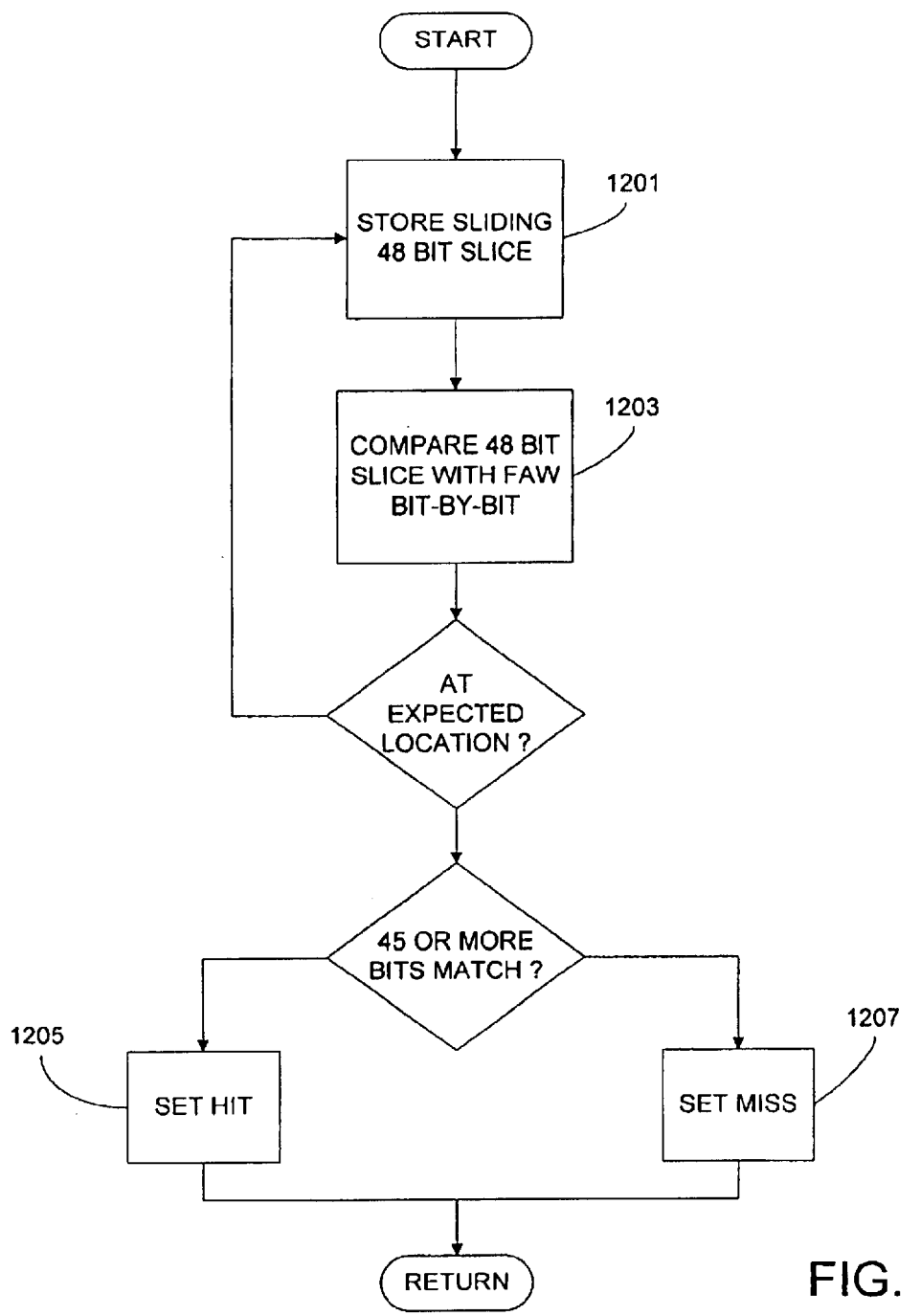

As shown in FIG. 11, on return the process enters a verify state (1003). During the verify state, the process verifies that the proper framing pattern has been located. FIG. 13 illustrates a flow diagram of the verify state. As in the search state, a sliding 48-bit slice is compared with the FAW (1201, 1203). The sliding 48-bit slice comparison is accomplished with each incoming bit. If the expected location of the FAW is reached, and 45 or more bits of the sliding 48 bit slice match the FAW, a hit is set (1205). If, at the expected location of the FAW, less than 45 bits match the FAW, a miss is set (1207). The process thereafter returns.

On return from the verify state the process determines if a hit or miss is active (1005). If miss is active, then the process returns to the search state. If hit is active the process transitions to a lock state.

Figure 14:
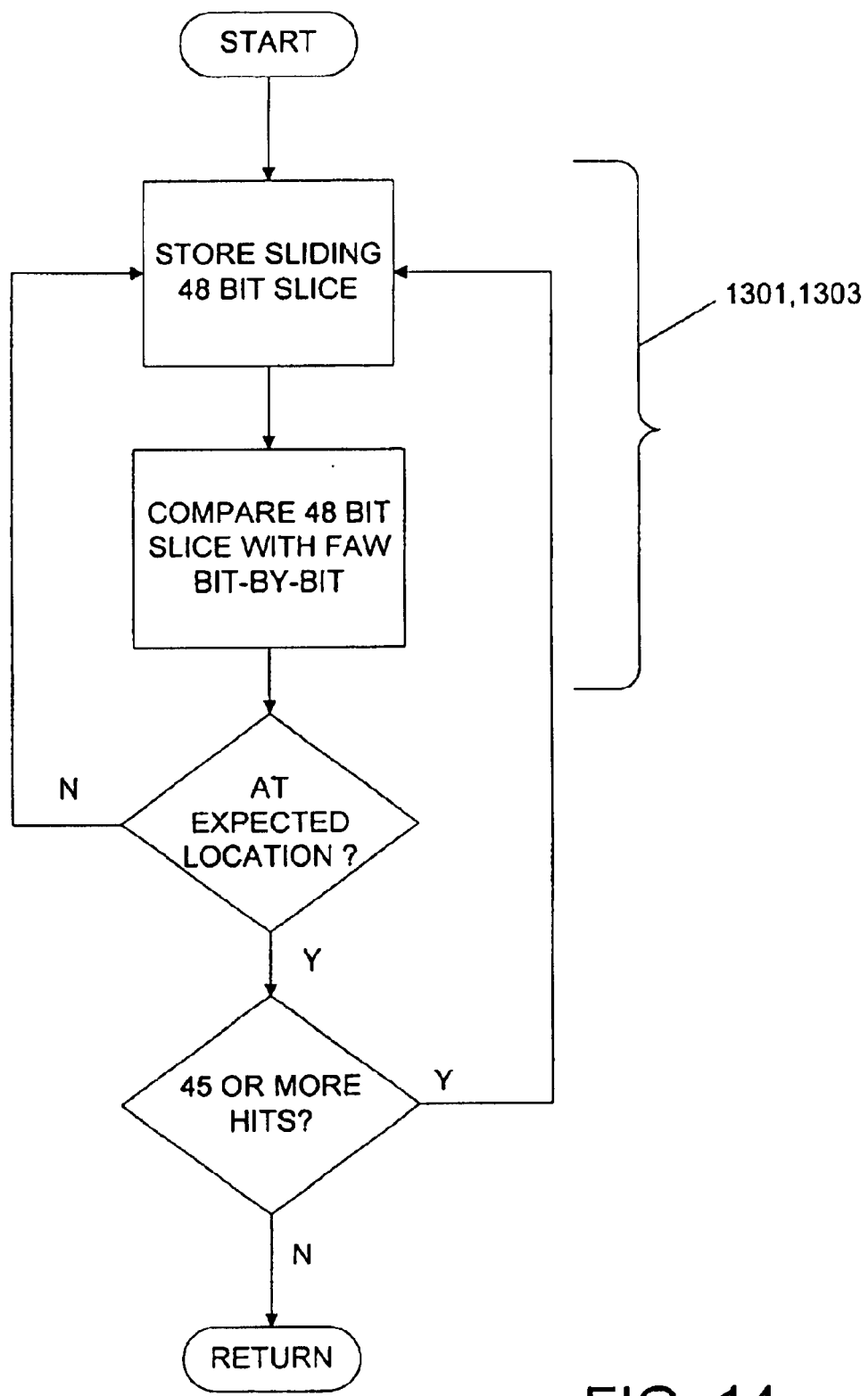

FIG. 14 illustrates a process of the lock state. As in the search state and the verify state, the process continually obtains a sliding 48 bit slice and compares the sliding 48 bit slice with the FAW bit by bit (1301, 1303). If at the expected location of the FAW the 48 bit slice matches at least 45 bits of the FAW the process continues comparing 48 bit slices with the FAW. If fewer than 45 bits of the 48 bit slice match the FAW at the expected location of the FAW, then the process exits and returns to the verify state.

Thus, the present embodiment has increased frame alignment capability in view of transmission errors. In a further embodiment, as the FAW bits are included in the encoded portion of the data block, framing, at least after the initial framing, occurs using corrected data. This allows for yet further increased framing ability.

Figure 15:
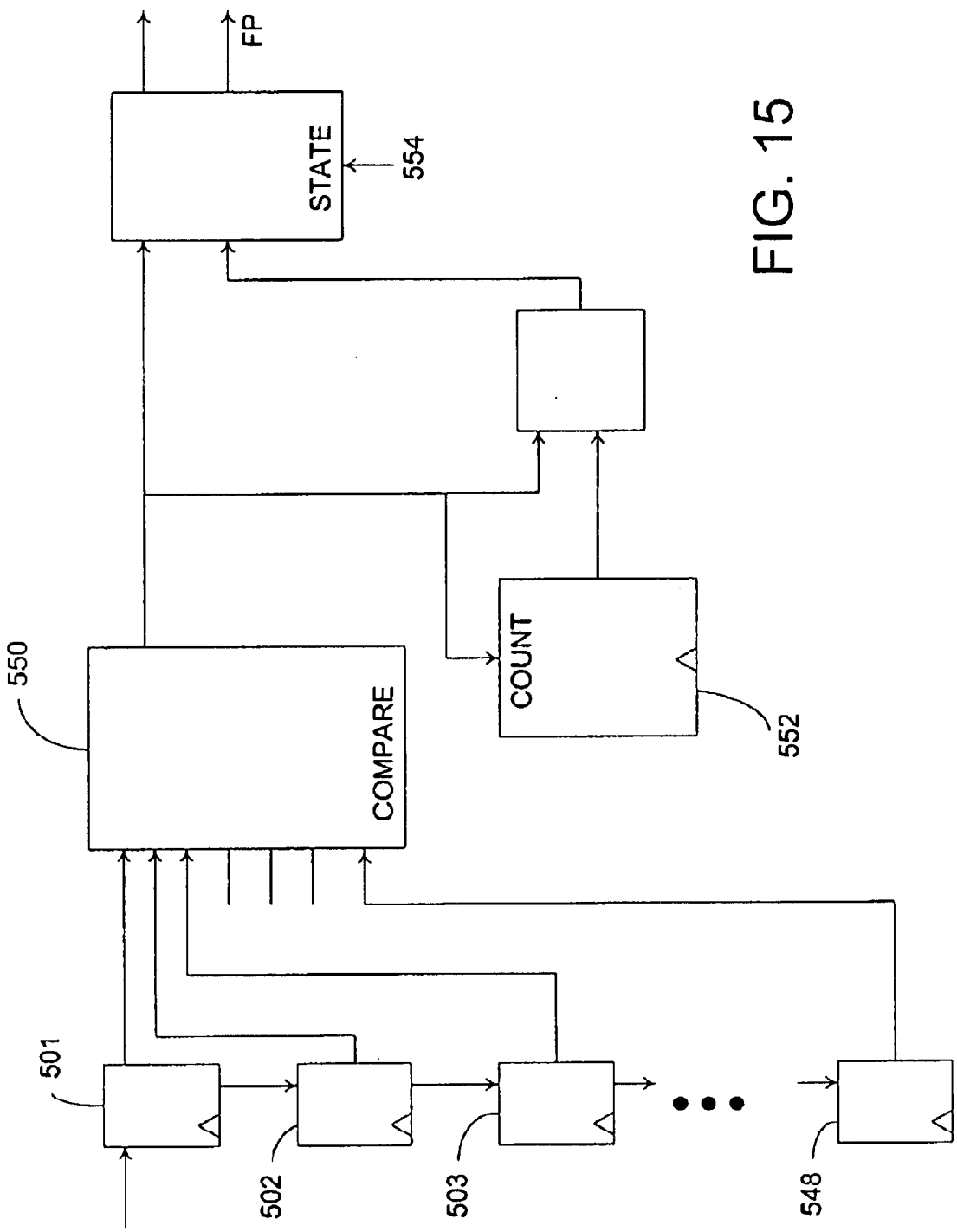
FIG. 15 is a block diagram of a system for performing the framing process in accordance with the framing process of FIG. 11.

FIG. 15 illustrates a block diagram of circuitry for performing framing in accordance with the process of FIG. 11. The framer of FIG. 15 includes 48 registers 501–548. A bit is shifted into the first register during a first clock cycle, and is then sequentially shifted through each of the remaining 47 registers. Accordingly, the shift registers provide a sliding 48-bit slice of an incoming data stream. The 48-bit slice is provided to a compare block 550. The compare block compares the 48 bits with a 48-bit frame alignment word. Comparison is done on a bit-by-bit basis. In other embodiments, the compare block is provided as additional inputs both the frame alignment word and an indication of the number of bits required for a match. The embodiment described in FIG. 15, if 45 of the 48 bits match the frame alignment word the compare block outputs a match. The match is used to reset a count block 552, and is also provided to a state determination block 554.

The state block also receives an input derived from the count block and the compare block, which provides a state block an indication of matches at the expected location of the frame alignment word. The state block is therefore able to determine whether an appropriate state is search, verify, or lock. In addition, the state block generates a plain pulse signal on matches when in the Lock State.

Figure 9:
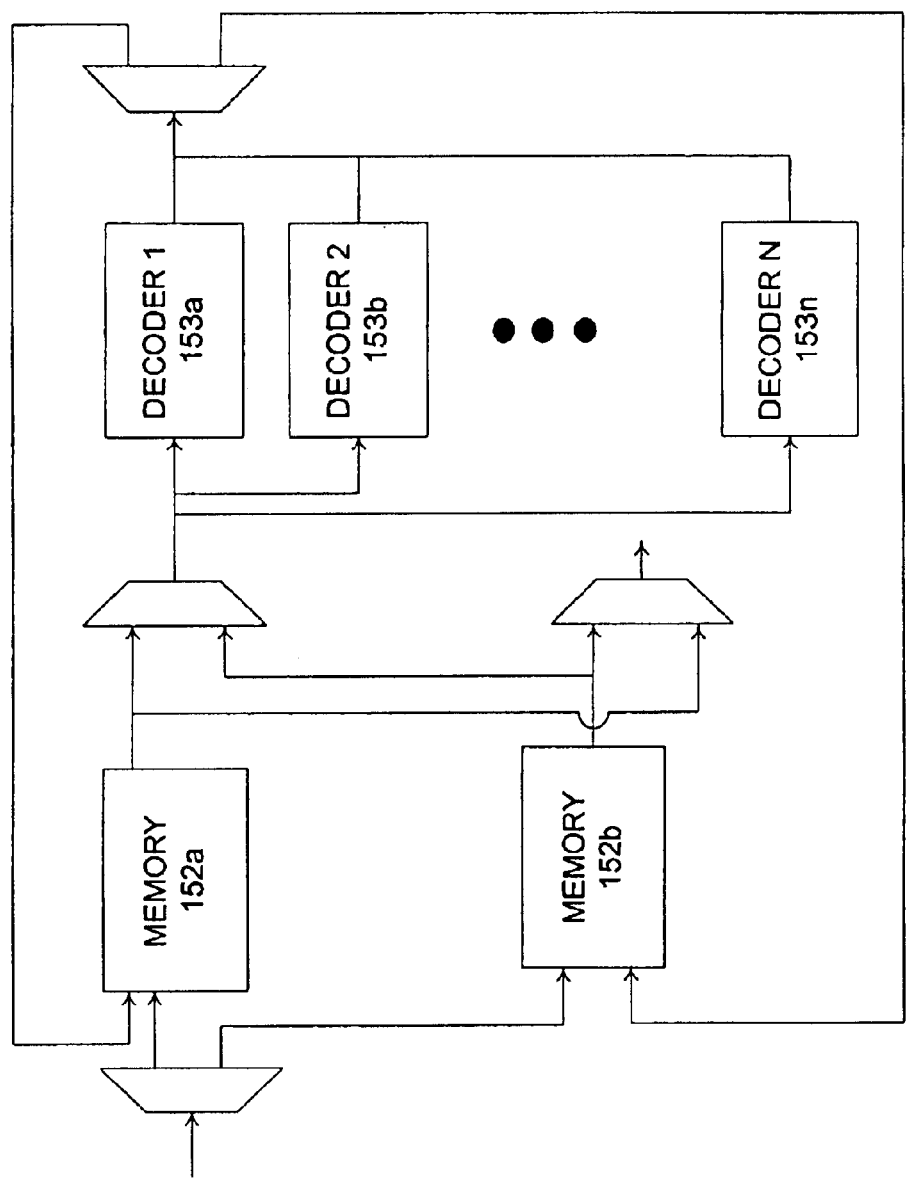
FIG. 9 is a block diagram of a decoder including memories used in the system of FIG. 6.

Returning to the system of FIG. 6, a decoder for use in the system of FIG. 6 is illustrated in FIG. 9. The decoder of FIG. 9 includes two memories 152a,b, with each memory a 256 bit by 256 bit memory. Data is read into the memory in the same predefined order that it was read out from the memory of the encoder during the transmission process.

The memories are coupled to N decoders 153a–n, with N equal to 64 in the embodiment of FIG. 9. The 64 decoders are each provided a byte of data from the memory at a time. Each of the bytes is part of a different virtual row. After each decoder is provided one row's worth of data, the decoder is able to correct the row. The corrected row is then provided to the memory and overwrites the uncorrected row. As described with respect to FIG. 5, this process continues until 239 rows have been decoded. Data is then provided to the decoders from the memory by column. This also occurs a byte at a time, and continues until 255 columns have been decoded and corrected.

The memories are dual port memories, allowing concurrent read and write access. Accordingly, for example, corrected rows may be written into memory while uncorrected rows are being read from memory to allow decoding.

Figure 10:
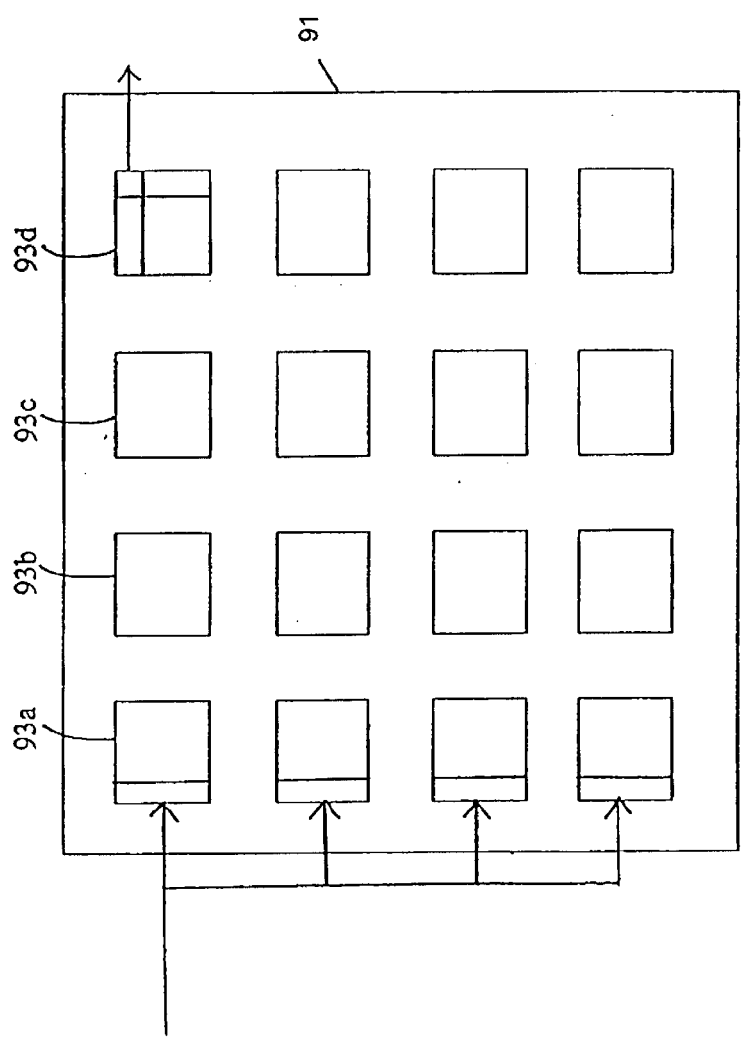
FIG. 10 illustrates a memory used with the encoder and decoders of FIGS. 7 and 9.

FIG. 10 illustrates a memory 91 suitable for the memories of the encoders and decoders. The memory forms a 256 bit by 256-bit memory. The memory is subdivided into 16 64×64 RAMs 93a–p. For discussion purposes the RAMs may be considered to form four horizontal rows and four vertical columns, with the RAM in the first row and column being the upper left RAM, and the RAM in the last row and column being the bottom right RAM. Each of the RAMs is addressable by row and column. In one embodiment data is stored in the memory as is depicted in the data block of FIG.

8. Accordingly, a first 64×64 RAM 93a contains the first 64 columns of the first 64 rows. Similarly, a fourth RAM 93d contains columns 193–256 of the first 64 rows. Thus, during the decoding process data is first provided to the encoder from the first rows, and then from succeeding rows. During the decoding process the succeeding rows are still being read and provided to the decoder while the first rows are receiving corrected row data.

In an alternate embodiment, and as partially indicated in FIG. 10, each RAM is divided into eight super columns and eight super rows. Each super column contains eight RAM columns, and each super row contains eight RAM rows. Each super column and super row, therefore contains 512 bits. In the alternate embodiment, a super row or a super column may be read or written each clock cycle. Moreover, as each RAM is individually addressable up to 8×512 bits may be written into or read from the memory at a time.

The memory of FIG. 10 is used both for the encoder and for the decoder. Beneficially, data is transmitted in bulk into the memory by supercolumn, with each of four RAMs (viewed vertically in FIG. 10) receiving a supercolumn. Thus 4×512, or 2048, bits are transferred into the memory at a time. Similarly, a supercolumn is transferred out of each of four vertical RAM simultaneously when data is passed from the encoder to the transmitter for transmission. Accordingly, as previously stated the transmitter transmits data by column, and data is both read out of the encoder and read into the decoder in the same order.

Although the RAMs are filled by column in parallel during loading operations, the memory is read by super row during row decoding. Accordingly, a first super row is read from a RAM during a first clock cycle. This read provides 512 bits; namely eight bits for each of the 64 decoders. As each of the decoders is operating on a single row (or column) at a time, each 512 bits of the super row contains a byte from a single row. After a first super row has been read from a first RAM, a second super row is read from a second adjacent RAM, until the four adjacent RAMs have each had a super row read. Second, third, and fourth super rows are thereafter subsequently read from each of the first row of RAMs, and then the processing continues to the second, third, and fourth rows of RAMs respectively. During decoder processing only 2 RAMs are accessed; one for syndrome input and one for error correction write-back. Further, as should be understood, while subsequent super rows are being read for decoding, prior super rows which have been corrected by the decoders are also being written back into memory.

After each row has been subsequently read-out, processing begins by column. Operation by columns is similar to that of rows.

Figure 16:
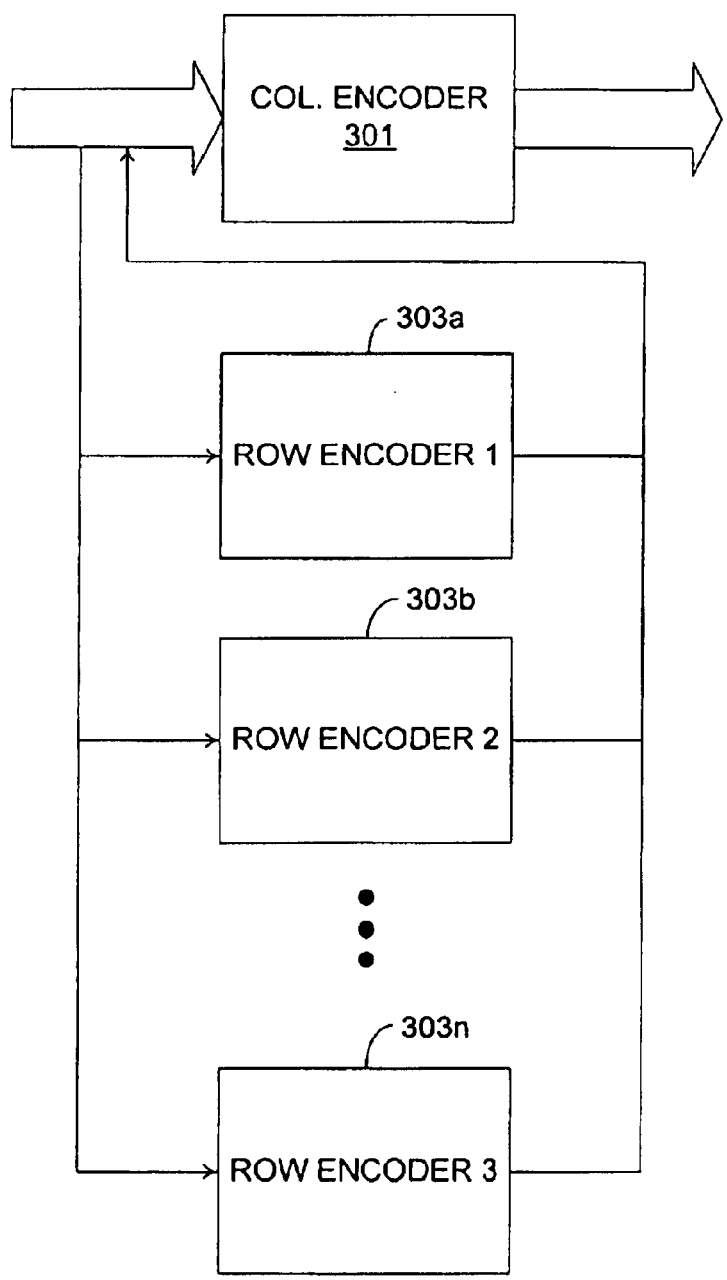
FIG. 16 is a block diagram of an encoder of a further embodiment of the system of FIG. 6.

In a further embodiment, memory of the type shown in FIG. 10 is not used in the encoder. In addition, instead of the two memories in use in the decoder, four memories are used. Thus, in the further embodiment, no additional layout space is required for RAM. FIG. 16 illustrates a block diagram of encoder operation of the further embodiment. The further embodiment encoder includes a single parallel column encoder 301. A further embodiment of the encoder also includes 239 row encoders. The 239 row encoders are allocated one per row. Thus, if N rows are used then N encoders 303a–n are also allocated.

As in previously discussed embodiments, data is transferred to the encoder by column. Accordingly, a column's worth of data is provided to the column encoder. Similarly, each row encoder receives one bit of the column data. The column encoder, in parallel, processes the column and outputs a 255-bit column. The 255-bit column is then transferred out to the transmitter, as well as any other circuitry adding, for example, overhead bits, and transmitted by the transmitter.

The above process continues column by column until 239 columns have been received and encoded. On receipt of the 239th column, each of the row encoders has received 239 bits, and are able to complete the encoding by row. By transferring one bit out at a time, each of the row encoders provides a column's worth of data (namely columns of redundant row bits) to the column encoder. The column encoder then encodes the row data and forms yet an additional column. This continues until the 240th to 255th columns are encoded and transferred to the transmitter over transmission of the transmission medium.

In addition, it is generally convenient to additionally provide elastic data storage, such as an elastic FIFO, for input data to the encoder. An elastic FIFO is useful in that, as previously described; more data is clocked out of the encoder due to the additional redundant bits than is clocked into the encoder.

In one embodiment, four encoders are provided. Prior to transmission over the transmission media, the data from each of the four encoders is interleaved. In one embodiment this is bit by bit, although in other embodiments the interleave is for example by column or even by supercolumn.

On reception, the receive data is deinterleaved and provided to one of each of four memories. Each of the four memories is as described with respect to FIG. 10. Each of the four memories is, as previously described, coupled to a decoder. Conveniently, however, assuming the same transmission speeds for serial data as with the previously described systems, the decoder of the presently discussed embodiment need not operate at as high a clock speed as additional storage is available per a clock cycle basis. Thus, using this alternative embodiment data is transferred from the memory of the encoder to the transmitter 8192 (2048×4) bits at a time, i.e., per clock cycle.

Accordingly, the present invention provides a forward error correction system and methods. Although this invention has been described in certain specific embodiments, many additional modifications and variations will be apparent to those skilled in the art. It is therefore to be understood that this invention may be practiced otherwise than as specifically described. Thus, the present embodiments of the invention should be considered in all respects as illustrative and not restrictive, the scope of the invention being indicated by the appended claims and their equivalents rather than the foregoing description.

What is claimed is:

1. In an error correction system which decodes code words using a product code in which symbols appear in multiple code words and each code word is encoded using an error correction code having an error correction capability, a method of increasing error correction capability, the method comprising:
   determining a plurality of code words which have a number of errors greater than the error correction capability of the error correction code used to encode the code word;
   determining symbols common to at least two of the plurality of code words; and
   inverting the common symbols.

2. The method of claim 1 wherein code words are arranged in dimensions, the code words in each dimension sharing symbols only with code words in other dimensions.

3. The method of claim 2 wherein inverting the common symbols only occurs if the likely number of common symbols containing errors is at least half of the common symbols.

4. The method of claim 3 wherein each code word is encoded with error correction codes having the same error correction capability.

5. The method of claim 4 wherein inverting the common symbols only occurs if the number of code words containing uncorrectable errors does not exceed 2(n+1), where n is the error correction capability of the error correction codes.

6. The method of claim 5 wherein the number of dimensions is two.

7. The method of claim 6 wherein the code is a BCH code.

8. A method of performing multidimensional forward error correction comprising:
- encoding using an error correction code information symbols comprised of input data to form first code words and second code words, the first and second code words sharing at least some symbols;
- providing received symbols comprising potentially corrupted symbols of the first code words and second code words to a decoder, the received symbols forming first received symbols and second received symbols sharing at least some symbols;
- decoding the first received symbols, including correcting at least some of the potentially corrupted symbols shared with the second received symbols; and
- decoding the second received symbols, the second received symbols including symbols corrected during the decoding of the first received symbols, including correcting at least some of the potentially corrupted symbols shared with the first received symbols;
- further repetitively decoding the first received symbols and the second received symbols, each decoding using symbols as corrected during previous decoding;
- determining uncorrectable first received symbols and uncorrectable second received symbols; and
- inverting symbols shared by at least one of the uncorrectable first received symbols and at least one of the uncorrectable second received symbols.

9. The method of claim 8 further comprising further decoding the first received symbols and the second received symbols, each decoding using symbols as corrected during previous decoding or inverting.

10. The method of claim 9 wherein inverting symbols is accomplished for all of the symbols shared by any of the uncorrectable first received symbols and the uncorrectable second received symbols.

11. The method of claim 10 wherein inverting symbols is not performed if the number of symbols shared that is greater than twice the likely number of incorrect symbols shared.

12. The method of claim 11 wherein the likely number of incorrect symbols shared is based on the number of incorrect symbols per code word exceeding an error correction capability of the error correction code by a predetermined number of symbols.

13. The method of claim 12 wherein the predetermined number is one symbol greater than the error correction capability of the error correction code.

14. A product code based decoding system for use in a forward error correction system, the forward error correction system using a product error correction code, the decoding system being provided received words, the received words comprising intersecting first dimension code words and second dimension code words, the decoding system comprising:
- a memory, the memory storing the received words; and
- a plurality of decoders, the plurality of decoders configured to receive the first dimension code words and the second dimension code words from the memory and configured to provide corrected first dimension code words and corrected second dimension code words to the memory; and
- a memory overwrite circuit, the memory overwrite circuit configured to track uncorrectable first dimension code words and uncorrectable second dimension code words and to invert symbols common to any of a one of the uncorrectable first dimension code words and any of a one of the uncorrectable second dimension code words.

15. The decoding system of claim 14 wherein the received words further comprise first dimension parity symbols for the first dimension code words.

16. The decoding system of claim 15 further comprising a parity circuit receiving the first dimension parity symbols, the first dimension code words, and an error location polynomial and providing an error correction control signal.

17. The decoding system of claim 16 wherein the parity circuit compares the first dimension parity symbol with the parity of the first dimension code words, and generates the error correction control signal based on the results of the comparison.

* * * * *